(12) United States Patent  (10) Patent No.: US 8,451,622 B2
Yu  (45) Date of Patent: May 28, 2013

(54) CIRCUIT BOARD MODULE

(75) Inventor: Yen-Po Yu, Taipei (TW)

(73) Assignee: ASUSTeK Computer Inc., Taipei (TW)

( * ) Notice: Subject to any disclaimer, the term of this patent is extended or adjusted under 35 U.S.C. 154(b) by 92 days.

(21) Appl. No.: 12/954,678

(22) Filed: Nov. 26, 2010

(65) Prior Publication Data

US 2011/0128702 A1 Jun. 2, 2011

(30) Foreign Application Priority Data

Nov. 27, 2009 (TW) .............................. 98140668 A

(51) Int. Cl.
H05K 7/20 (2006.01)
(52) U.S. Cl.
USPC ............. 361/800; 361/753; 361/760; 174/59; 174/67; 439/689; 439/701
(58) Field of Classification Search
USPC ................. 361/688, 692, 694, 695, 704, 707, 361/715, 717–722, 755, 760, 761, 763, 764, 361/784, 785, 789, 800, 801, 753
See application file for complete search history.

(56) References Cited

U.S. PATENT DOCUMENTS

| 5,414,597 | A | * | 5/1995 | Lindland et al. ............. 361/816 |
| 5,497,495 | A |   | 3/1996 | Ishikawa et al. |
| 5,566,050 | A | * | 10/1996 | Seto et al. ................ 361/679.43 |
| 6,088,224 | A | * | 7/2000 | Gallagher et al. ............ 361/695 |
| 6,324,075 | B1 |   | 11/2001 | Unrein et al. |
| 7,397,670 | B2 | * | 7/2008 | Su ................... 361/752 |
| 7,760,515 | B2 | * | 7/2010 | Sun .............................. 361/818 |
| 7,848,105 | B2 | * | 12/2010 | Holmes et al. ................ 361/695 |
| 2005/0265003 | A1 |   | 12/2005 | Coglitore et al. |
| 2007/0109752 | A1 | * | 5/2007 | Xiao et al. ..................... 361/724 |
| 2010/0085687 | A1 | * | 4/2010 | Shannon et al. ............. 361/624 |

FOREIGN PATENT DOCUMENTS

| CN | 101004625 | 7/2007 |
| CN | 101312635 | 11/2008 |
| DE | 102006006565 | 8/2007 |

* cited by examiner

Primary Examiner — Courtney Smith
(74) Attorney, Agent, or Firm — Jianq Chyun IP Office

(57) ABSTRACT

A circuit board module includes a circuit board, a plurality of electronic components, a plurality of connectors and a cover. The circuit board includes a heat dissipation unit. The electronic components, the connectors and the heat dissipation unit are disposed on a first surface of the circuit board. The cover has a plurality of openings with the shapes and the sizes corresponding to the connectors and the heat dissipation unit. When the cover covers the circuit board, the openings expose the connectors and the heat dissipation unit. Users can plug and pull the connectors of the circuit board through the openings. The size of the cover is corresponding to the circuit board. The circuit board module is dust-proof and can prevent the users from accidentally touching the electronic components.

8 Claims, 2 Drawing Sheets

CIRCUIT BOARD MODULE

CROSS-REFERENCE TO RELATED APPLICATION

This application claims the priority benefit of Taiwan application serial no. 98140668, filed on Nov. 27, 2000. The entirety of the above-mentioned patent application is hereby incorporated by reference herein and made a part of this specification.

BACKGROUND OF THE INVENTION

1. Field of the Invention

The invention relates to a circuit board and, more particularly, to a circuit board with a cover.

2. Description of the Related Art

In recent years, the operating speed of a computer increases continuously along with the rapid advance of computer technology. The heating power of electronic components in the computer increases continuously as well. As a result, the electronic components with low heat dissipation efficiency would easily go overheat and fail temporarily or permanently.

For better heat dissipation efficiency, some users put the circuit board out of the computer system instead of inside the system. However, it is unaesthetic to expose the circuit board outside since the circuit board has many messing components on it. Furthermore, the circuit board has many aculeate portions, and thus the users easily get hurt by an accidental touch on the aculeate portions if the aculeate portions are not covered. Moreover, if the electronic components on the circuit board contact with a human body or other conduction objects, the users may get an electric shock, or the electronic components may be damaged.

BRIEF SUMMARY OF THE INVENTION

A circuit board module (such as motherboard) includes a circuit board, a plurality of electronic components, a plurality of connectors, a heat dissipation unit and a cover is disclosed. The electronic components, the connectors, the heat dissipation unit and the cover are disposed on a first surface of the circuit board. The cover has a plurality of openings corresponding to the electronic components, for the connectors and the heat dissipation unit of the circuit board to be exposed.

A cover for a circuit board, cooperating with a circuit board having a plurality of electronic components and connectors, the cover comprising: a body covering part of the circuit board; and a plurality of openings formed on the body; wherein the openings are formed correspondingly to the connectors on the circuit board.

In an embodiment, a flow-guide structure is disposed on one side of the cover toward the circuit board of the circuit board to guide the airflow generated by the heat dissipation units (such as a fan). The circuit board further includes a heat pipe contacting with the electronic components. The airflow generated by the fan passes through the heat pipe and removes the heat on the heat pipe.

In an embodiment, the cover further includes a shield disposed near the openings to shield the openings that are not for use temporary.

In an embodiment, the connectors may be a central processing unit (CPU) connector, a memory connector, a data line connector, a video graphics array (VGA) connector or a universal serial bus (USB) connector.

Based on the above, on the motherboard, the cover shields the electronic components but exposes the connectors. Hence, the circuit board is not only with aesthetic feelings, but also more convenient and safe for users.

These and other features, aspects, and advantages of the present invention will become better understood with regard to the following description, appended claims, and accompanying drawings.

DETAILED DESCRIPTION OF THE EMBODIMENTS

Figure 1:
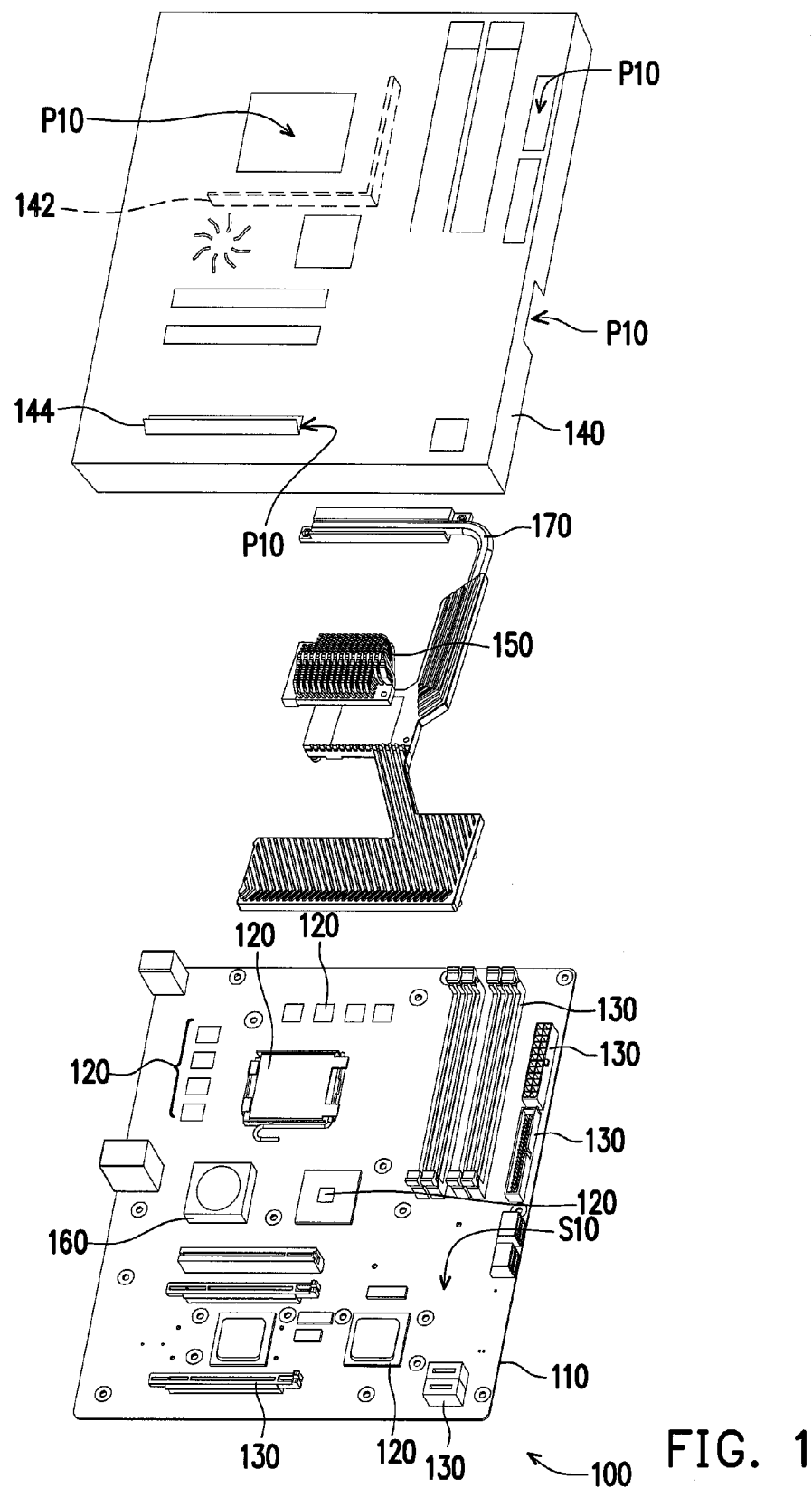
FIG. 1 is an exploded diagram showing a circuit board module according to an embodiment of the invention.
Figure 2:
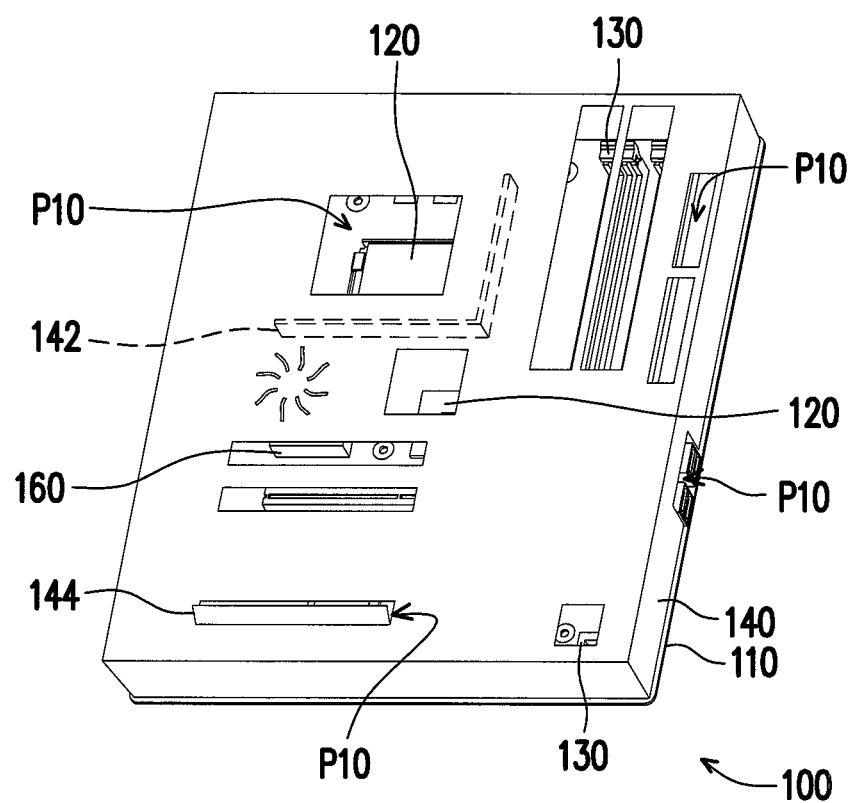
FIG. 2 is a schematic diagram showing the assembled circuit board module in FIG. 1.

FIG. 1 is an exploded diagram showing a circuit board module according to an embodiment, and FIG. 2 is a schematic diagram showing the assembled circuit board module in FIG. 1. Please refer to FIG. 1 and FIG. 2, a circuit board module 100 in this embodiment includes a circuit board 110, a plurality of electronic components 120, a plurality of connectors 130 and a cover 140. The electronic components 120, the connectors 130 and the cover 140 are disposed on a first surface S10 of the circuit board 110. The cover 140 covers the electronic components 120. The cover 140 has a plurality of openings P10 exposing the connectors 130.

In this embodiment, there are varies electronic components 120 and is not limited thereto. The electronic components 120 may be a south bridge chipset, a north bridge chipset, a network chipset, a graphic processing unit (GPU), a sound effect chipset, a capacitor, a resistor or other electronic components. Further, there are varies connectors 130 in this embodiment and is not limited thereto. Besides, a CPU or a memory module is selectively disposed on the circuit 110, and the number of the openings P10 may be different from that of the connectors 130. Some openings P10 may expose some electronic components 120 to facilitate additional heat dissipation module 150 (such as a heat dissipation unit or a fan, not shown in figures) to enhance heat dissipation efficiency of the electronic components 120.

The connectors 130 in this embodiment includes, for example, a CPU connector, a memory connector, a data line connector (for connecting a hard disk drive (HDD), an optical disk drive (ODD) or other storage devices), a power line connector and a USB connector or other data or signals connectors with different specification.

In an embodiment, the cover 140 covers the electronic components 120 but exposes the connectors 130. The cover 140 may cover the circuit board 110 and the electronic components 120 to provide a concise appearance. A tracery, a pattern or other decoration may be further formed on the cover 140 to promote the aesthetic features of the circuit board module 100. Besides, since the cover 140 only exposes the connectors 130, the positions of the connectors 130 are clear and easy to be found and it is convenient for the users to connect the circuit board module 100 with expansion cards or storage devices. Moreover, the users would not get hurt by an accidental touch on the aculeate portions when the cover 140 covers part of the circuit board 110 and the electronic components 120. Furthermore, the cover will keep the electronic components 120 from contacting with human body or other objects that are conductive, and thus to avoid the users to get an electric shock, and the electronic components 120 can also keep from damages of electronic conduction.

The circuit board module 100 in this embodiment further includes a fan 160 disposed on an electronic component (not shown in figures) that generates heat between the circuit board 110 and the cover 140. The fan 160 dissipates the heat generated from the electronic components 120 in the space between the circuit board 110 and the cover 140. In this embodiment, a flow-guide structure 142 is formed on one side of the cover 140 toward the circuit board 110 to guide the airflow generated by the fan 160 to increase heat dissipation efficiency. A heat pipe 170 is further equipped on the dissipation module 150 and disposed on the electronic components 120 on the circuit 110 in this embodiment, and the heat pipe 170 contacts some electronic components 120 directly. In other words, the heat generated by the electronic components 120 can be removed by the heat pipe 170. Besides, the airflow generated by the fan 160 also gets through the heat pipe 170 to dissipate heat accumulated on the heat pipe 170. Since the flow-guide structure 142 on the cover 140 restricts and guides the airflow generated by the fan 160 appropriately, the heat dissipation efficiency is thus enhanced.

The cover 140 in this embodiment further includes a shield 144 disposed on any one of the openings P10. The shield 144 is used to shield any openings as requirement, and it is freely to be detached from the openings to expose the components inside the cover 140. For more details, when the connector 130 exposed via the opening P10 is not being used to connect with other external elements, the shield 144 can shield the opening P10 to prevent dust accumulating on the connector 130 and avoid the connector 130 from being damaged. It is to be understood that the shield 144 showed in this embodiment is only one, but the number of the shield 144 may be changed by demand.

In conclusion, the cover shields the electronic components of the circuit board but exposes the connectors as requirement. Thus, the circuit board module has the advantages of good appearance, convenient and safe. Besides, if a fan is disposed between the cover and the circuit board, the cover can limit and guide the airflow generated by the fan appropriately to further enhance the heat dissipation efficiency.

Although the invention has been described in considerable detail with reference to certain preferred embodiments thereof, the disclosure is not for limiting the scope of the invention. Persons having ordinary skill in the art may make various modifications and changes without departing from the scope of the invention. Therefore, the scope of the appended claims should not be limited to the description of the preferred embodiments described above.

What is claimed is:

1. A circuit board module comprising:
   a circuit board;
   a plurality of electronic components disposed on the circuit board;
   a plurality of connectors disposed on the circuit board; and
   a cover covering the circuit board, wherein the cover has a plurality of openings to expose the connectors on the circuit board, wherein the cover further comprises a detachable shield, the detachable shield covers a cross-section of at least one of the openings when the detachable shield is attached to the cover and the at least one of the openings is not in use.

2. The circuit board module according to claim 1 further comprising a heat dissipation unit contacting with one of the electronic components.

3. The circuit board module according to claim 2, wherein a flow-guide structure is formed at one side of the cover toward the circuit board to guide airflow inside the cover.

4. The circuit board module according to claim 2, wherein the heat dissipation unit is a fan.

5. The circuit board module according to claim 1, wherein the connectors comprises a central processing unit (CPU) connector, a memory connector, a data line connector, a video graphics array (VGA) connector, a power line connector or a universal serial bus (USB) connector.

6. A cover for a circuit board, cooperating with a circuit board having a plurality of electronic components and connectors, the cover comprising:
   a body covering part of the circuit board; and
   a plurality of openings formed on the body;
   wherein the openings are formed correspondingly to the connectors on the circuit board;
   wherein the cover further comprises a detachable shield, the detachable shield covers a cross-section of at least one of the openings when the detachable shield is attached to the cover and the at least one of the openings is not in use.

7. The cover according to claim 6, wherein a flow-guide structure is formed at one side of the cover toward the circuit board.

8. The cover according to claim 6, wherein the connectors on the circuit board comprises a central processing unit (CPU) connector, a memory connector, a data line connector, a video graphics array (VGA) connector, a power line connector or a universal serial bus (USB) connector.

* * * * *